United States Patent
Tran et al.

(10) Patent No.: US 8,421,448 B1
(45) Date of Patent: Apr. 16, 2013

(54) HALL-EFFECT SENSOR SYSTEM FOR GESTURE RECOGNITION, INFORMATION CODING, AND PROCESSING

(75) Inventors: Nghia Tran, San Diego, CA (US); Sunny Fugate, Albequerque, NM (US); Marion Ceruti, San Diego, CA (US); Lorraine Duffy, San Diego, CA (US); Hoa Phan, Escondido, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 641 days.

(21) Appl. No.: 12/695,932

(22) Filed: Jan. 28, 2010

(51) Int. Cl.
*G01B 7/14* (2006.01)
*G01B 7/30* (2006.01)
*G01R 33/06* (2006.01)

(52) U.S. Cl.
USPC ..................................................... 324/207.2

(58) Field of Classification Search ................ 324/207.2
See application file for complete search history.

(56) References Cited

U.S. PATENT DOCUMENTS

| | | | | |
|---|---|---|---|---|
| 6,035,274 | A * | 3/2000 | Kramer et al. | ................. 704/270 |
| 8,279,091 | B1 * | 10/2012 | Tran et al. | ........................ 341/20 |
| 2006/0113990 | A1 * | 6/2006 | Schodlbauer | ............ 324/207.24 |

* cited by examiner

*Primary Examiner* — Reena Aurora
(74) *Attorney, Agent, or Firm* — Ryan J. Friedl; Kyle Eppele

(57) ABSTRACT

A system includes a controller, a Hall-effect sensor and transceiver connected to the controller; and a flux-producing element having a plurality of magnetic flux lines emanating therefrom. The system may be secured to or contained within a wearable glove. The flux-producing element may be coupled to an object separate from the wearable glove. The Hall-effect sensor transmits a Hall-effect sensor signal to the controller when the Hall-effect sensor is perpendicular to at least some of the plurality of magnetic flux lines. The Hall-effect sensor signal may include data received from the flux-producing element. The controller transmits a controller signal to the transceiver after receiving the Hall-effect sensor signal. The controller signal may include input from a motion sensor and/or an orientation sensor connected to the controller. The transceiver may transmit the signal to a remote processor. The signal may be used for gesture recognition, information coding, and/or information processing.

19 Claims, 13 Drawing Sheets

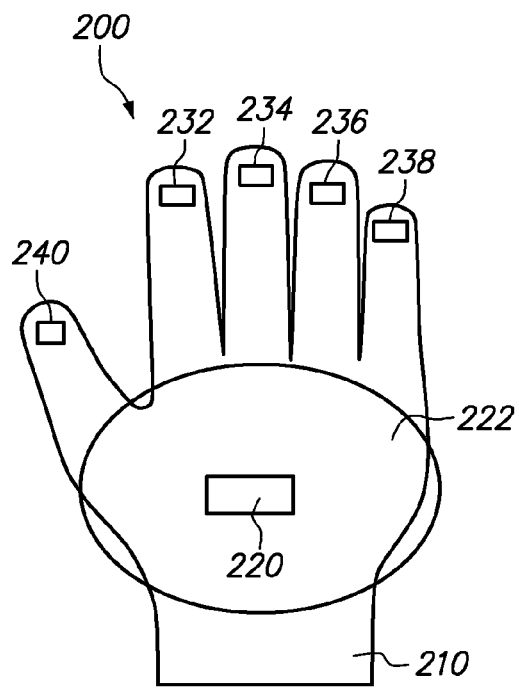
FIG. 3A
FIG. 3B
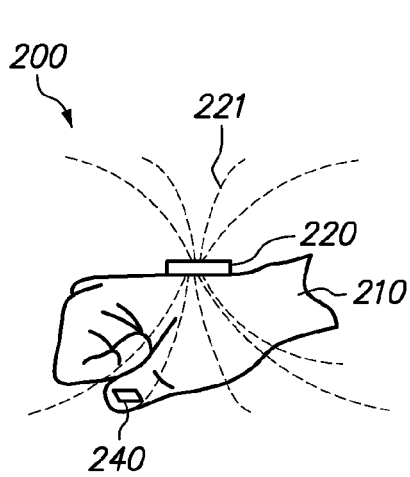
FIG. 3C
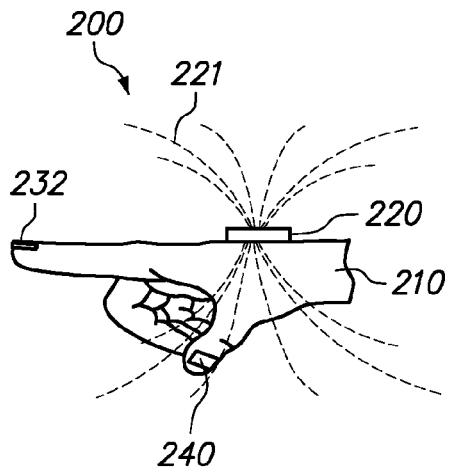
FIG. 3D

US 8,421,448 B1

HALL-EFFECT SENSOR SYSTEM FOR GESTURE RECOGNITION, INFORMATION CODING, AND PROCESSING

FEDERALLY SPONSORED RESEARCH AND DEVELOPMENT

The Hall-Effect Sensor System for Gesture Recognition, Information Coding, and Processing is assigned to the United States Government and is available for licensing for commercial purposes. Licensing and technical inquiries may be directed to the Office of Research and Technical Applications, Space and Naval Warfare Systems Center, Pacific, Code 2112, San Diego, Calif., 92152; voice (619) 553-2778; email ssc_pac_T2@navy.mil. Reference Navy Case No. 99847.

BACKGROUND

Certain scenarios require the use of non-verbal communication. Examples of traditional methods of non-verbal communication include hand signals, semaphores, and Morse code. However, traditional non-verbal communication methods limit the number of recipients that can receive the communication and limit the type of information that can be transmitted. Further, traditional non-verbal communication methods and motion-tracking methods, especially those that rely on human memory in the absence of automated storage, also limit the ability of recipients to save, for later analysis, detailed representations of the transmitted information accurately and electronically.

A need exists for a non-verbal communication system that overcomes the aforementioned drawbacks.

BRIEF DESCRIPTION OF THE DRAWINGS

FIGS. 3A-3D show examples of gesture diagrams involving the Hall-effect sensors and the magnetic flux lines emanating from a flux-producing element in the sensor unit, in accordance with the Hall-Effect Sensor System for Gesture Recognition, Information Coding, and Processing.

DETAILED DESCRIPTION OF SOME EMBODIMENTS

Figure 1:
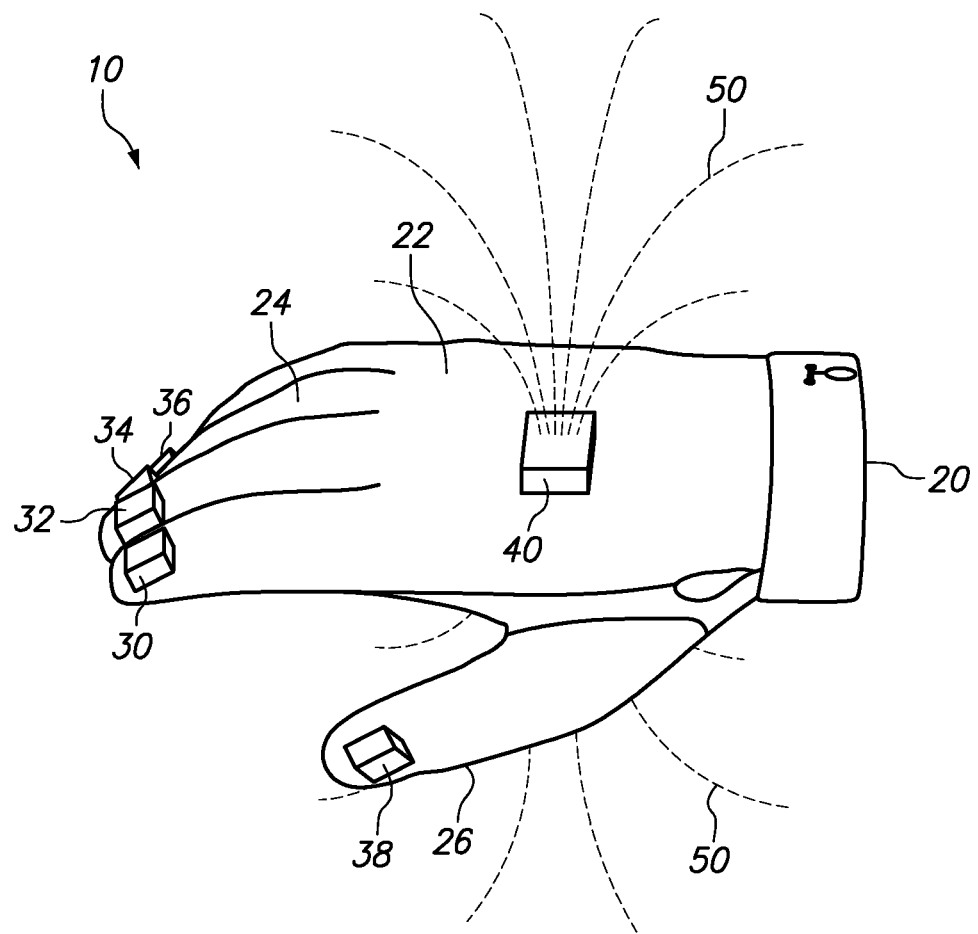
FIG. 1 shows a diagram of a wearable glove Hall-effect sensor system in accordance with the Hall-Effect Sensor System for Gesture Recognition, Information Coding, and Processing.

FIG. 1 shows a diagram of a wearable glove Hall-effect sensor system 10 in accordance with the Hall-Effect Sensor System for Gesture Recognition, Information Coding, and Processing. System 10 involves a hand-mounted system wherein finger position may be determined with respect to the hand, and hand position may be determined with respect to the body or other objects. System 10, as well as the other systems described herein, provide relative positional output that may be interpreted by consumer or end-user software as information including, but not limited to: gestures with semantic interpretation for human-to-human communication, gestures with semantic interpretation for human-to-computer communication (i.e. human/computer interface or input device), and gestures with no semantic interpretation serving as instrumentation of the wearer (i.e. reporting relative physical position).

System 20 may include a wearable glove 20, including a palm portion 22, a plurality of finger portions 24, and a thumb portion 26, Hall-effect sensors 30, 32, 34, and 36 coupled to wearable glove 20 near the tip of each finger portion 24, Hall-effect sensor 38 coupled to glove 20 near the tip of thumb portion 26, and a sensor unit 40 coupled to glove 20 on the back of palm portion 22. As an example, glove 20 may be comprised of flexible leather-synthetic materials and have a Velcro® fastener at the wrist.

Sensor unit 40 includes a flux producing element (see FIG. 2) that has a plurality of magnetic-flux lines emanating therefrom, forming a magnetic-flux region. Hall-effect sensors 30, 32, 34, 36, and 38 are connected via wire to a controller contained within sensor unit 40. In some embodiments, when a user causes Hall-effect sensors 30, 32, 34, 36, and/or 38 to be moved within the magnetic flux region perpendicular to at least some of the magnetic-flux lines, current is induced within the Hall-effect sensor. In some embodiments, when a non-zero resolved vector component of the motion of the Hall-effect sensor is perpendicular to the non-zero resolved vector component of at least some of the plurality of magnetic flux lines, current is induced within the Hall-effect sensor. If the velocity of motion within the magnetic flux region is increased, a larger current is induced.

A voltage difference, termed the Hall-voltage, is generated within the Hall-effect sensor perpendicular to the plane described by the magnetic-flux direction and the direction of the current. In some embodiments, a signal representing the Hall-voltage, or an amplified version thereof, may be transmitted to the controller as the Hall-effect sensor signal. The controller then may process the Hall-effect sensor signal to provide sufficient data to determine which gestures have been made or may create a controller signal for transmission to a transceiver. Some examples of gestures are shown in FIGS. 3B-3D.

Figure 2:
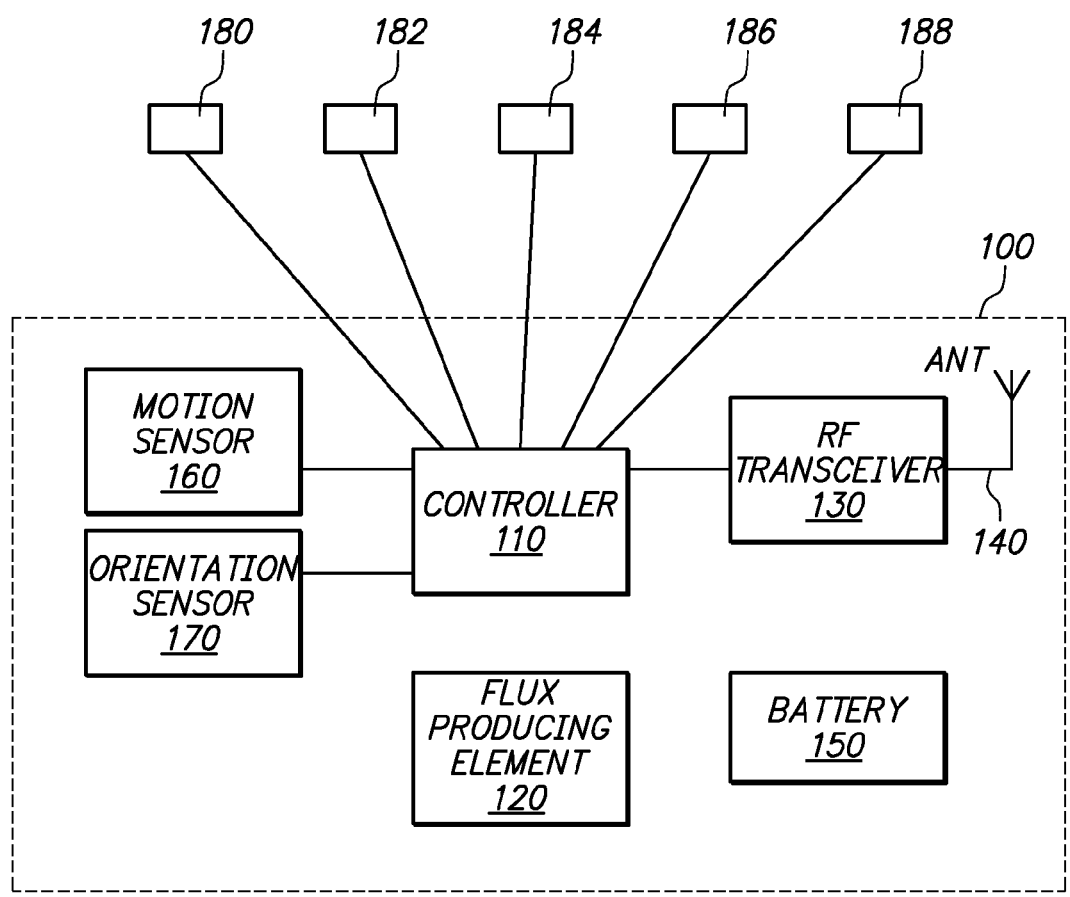
FIG. 2 shows a block diagram of an embodiment of a sensor unit connected to multiple Hall-effect sensors in accordance with the Hall-Effect Sensor System for Gesture Recognition, Information Coding, and Processing.

FIG. 2 shows a block diagram of an embodiment of a sensor unit 100 in accordance with the Hall-Effect Sensor System for Gesture Recognition, Information Coding, and Processing. Sensor unit 100 may be incorporated into Hall-effect sensor systems such as system 10 discussed with reference to FIG. 1. System 100 may include a controller 110, flux-producing element 120, RF transceiver 130, antenna 140, power supply 150, such as a battery, motion sensor 160, and orientation sensor 170. Controller 110 may contain signal-processing algorithms stored therein, and also may define transmission-data protocol.

In some embodiments, flux-producing element 120 is a permanent magnet. In other embodiments, flux-producing element 120 may comprise a simple conductor, such as an electromagnet, or any other magnetic flux-producing elements as recognized by one having ordinary skill in the art. As an example, motion sensor 160 may be a three-axis accelerometer for providing linear motion information and orientation sensor 170 may be a three-axis gyroscope to provide rotation motion information.

The Hall-effect sensors are configured to transmit a Hall-effect sensor signal to controller 110 when the Hall-effect sensor is moving within the magnetic flux region created by flux-producing element 120 and a non-zero resolved vector component of the motion of the Hall-effect sensor is perpendicular to the non-zero resolved vector component of at least some of the plurality of magnetic flux lines. In some embodiments, the Hall-effect sensor signal comprises encoded data for a particular Hall-effect sensor. In some embodiments, controller 110 is configured to analyze the Hall-effect sensor signal and determine particular hand gestures. Controller 110 may then transmit a signal to transceiver 130 after receiving the Hall-effect sensor signal. The signal transmitted from controller 110 may include information about particular determined hand gestures. Transceiver 130 is then configured to transmit the signal to a remote processor via antenna 140. Examples of remote processors may include a computer, such as computer 350 shown in FIG. 5, or another wearable glove Hall-effect sensor system.

Power supply 150 supplies power for all electronic components of sensor unit 100. As an example, power supply 150 may be a rechargeable battery. In such embodiments, controller 110 may be configured to monitor and control the recharge process for battery 150. Controller 110 also may be configured to monitor the battery level and inform a user of a low-battery level by means recognized by a person having ordinary skill in the art, such as a siren, chirp, flashing light, etc. In some embodiments, controller 110 also may be modified, augmented, and configured to capture and extract energy from hand-gestures or other bodily motions. This energy may then be used, for example, to recharge the battery.

FIGS. 3A-3D show examples of gesture diagrams 200 involving the Hall-effect sensors and the magnetic flux lines emanating from a flux-producing element, in accordance with the Hall-Effect Sensor System for Gesture Recognition, Information Coding, and Processing. As shown in FIG. 3A, a sensor unit 220, such as sensor unit 100 of FIG. 2, is secured to a hand 210. It should be recognized that in some embodiments, sensor unit 220 may be secured to a hand by various means including by adhesive or a strap, while in other embodiments sensor unit 220 may be secured to hand 210 via a glove apparatus as shown in FIG. 1. Hall-effect sensors 232, 234, 236, 238, and 240 are secured to hand 210 near the tips of the finger and thumb portions, and are connected via wire to sensor unit 220. In other embodiments, the Hall-effect sensors are secured to other portions of the user's fingers. Hall-effect sensors 232, 234, 236, 238, and 240 may be configured similarly to Hall-effect sensors 30, 32, 34, 36, and 38 as shown in FIG. 1.

It also should be recognized that applications of the Hall-Effect Sensor System for Gesture Recognition, Information Coding, and Processing are not limited to hand-related configurations, but also could be used to track, encode, and transmit information regarding motions of other parts of the body, such as the legs, feet, arms, neck, and head. As an example, applications of the Hall-Effect Sensor System for Gesture Recognition, Information Coding, and Processing that go beyond the use of only one or more gloves include automated range-of-motion tracking for physical therapy patients who may be recovering from injury accidents that cause limited mobility. In this application, a single physical therapist may be able to monitor the progress of many patients simultaneously, more accurately, and in a way that allows for issuing and storing alerts when motion thresholds are exceeded.

Sensor unit 220 contains a flux-producing element therein (not shown), having magnetic-flux lines 221 emanating therefrom. Magnetic flux lines create a magnetic flux region 222 around sensor unit 220. It should be recognized that magnetic-flux region 222 may be larger or smaller than as shown, depending on the strength of the flux-producing element within sensor unit 220. For example, magnetic-flux region 222 may encompass Hall-effect sensors 232, 234, 236, 238, and 240 even when such sensors are fully extended from sensor unit 220 as shown in FIG. 3B.

FIG. 3B illustrates a side view of a "stop" or "wait" gesture by hand 210, wherein each of Hall-effect sensors 232, 234, 236, 238, and 240 are fully extended from sensor unit 220, FIG. 3C illustrates a side view of a "closed fist" gesture by hand 210, and FIG. 3D illustrates a side view of a "number one" gesture by hand 210.

Figure 4A:
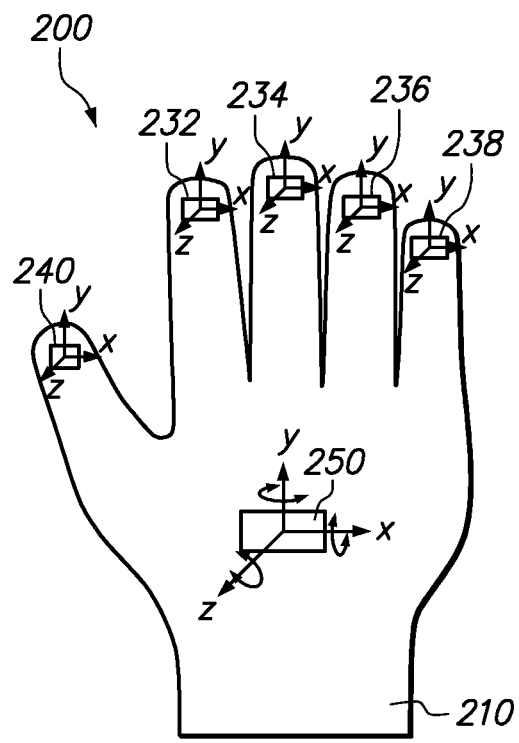
FIGS. 4A and 4B show diagrams illustrating the three-dimensional relationship between the rotational and linear motion sensors and the Hall-effect sensors, in accordance with the Hall-Effect Sensor System for Gesture Recognition, Information Coding, and Processing.
Figure 4B:
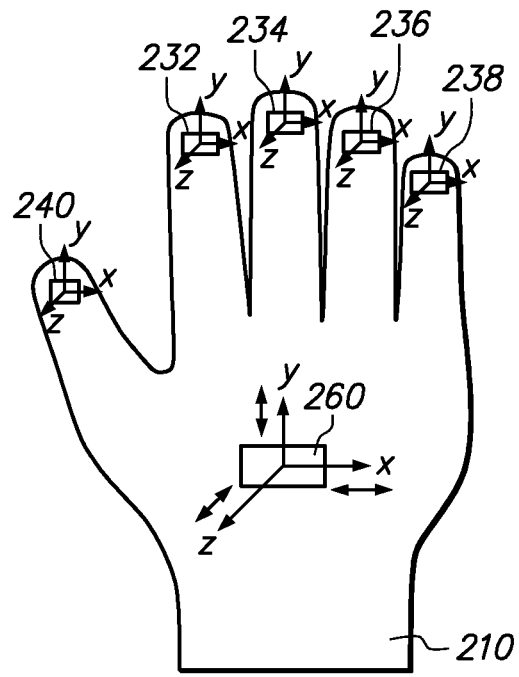

FIGS. 4A and 4B show diagrams illustrating the three-dimensional relationship between the rotational and linear motion sensors and the Hall-effect sensors, in accordance with the Hall-Effect Sensor System for Gesture Recognition, Information Coding, and Processing. FIG. 4A shows Hall-effect sensors 232, 234, 236, 238, and 240, as well as rotational motion sensor 250, connected to hand 210. FIG. 4B shows Hall-effect sensors 232, 234, 236, 238, and 240, as well as linear motion sensor 260, connected to hand 210.

The Hall-effect sensors represent 3-D vector XYZ sensors and are linked together to yield precision tracking and gesture recognition. As shown in the figures, each individual sensor is a virtual 3-D moving vector coordinate. Sensor data fusion occurs in the controller, such as controller 110, where the vector calculation also is performed to determine the relative position of the fingers with respect to the palm. In the case of Hall-effect sensors mounted on other parts of the body, the calculation could determine the relative position, for example, of the foot with respect to the thigh. In either case, the vector calculations yield the relationships between the sensors. These virtual coordinates XYZ linked and computed by the controller yield the relationships as fingers moving in 3-D space as vector points. The resultant force caused by the magnetic field from the flux-producing element acting on the Hall-effect sensors produces the virtual 3-D moving coordinates in space. Lines of magnetic flux pass through these 3-D sensors to create a virtual 3-D moving coordinate.

Figure 5:
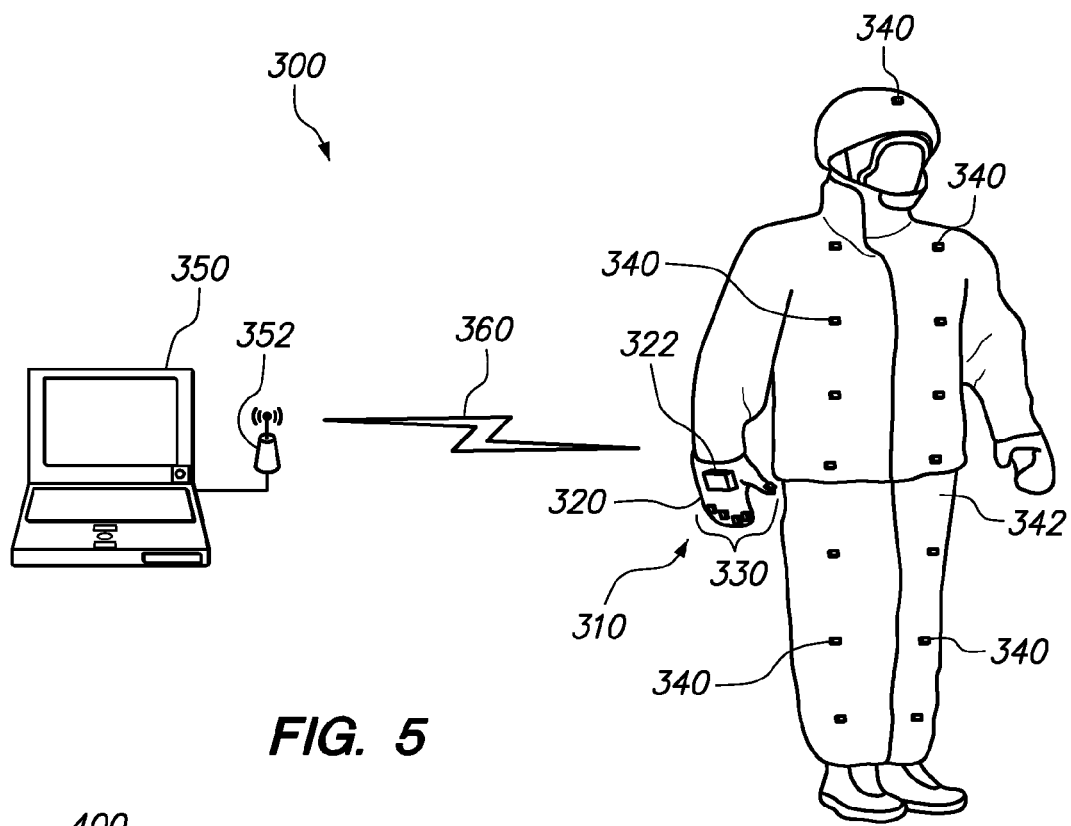
FIG. 5 shows an example of a wearable glove Hall-effect sensor system in communication with a remote processing device, in accordance with the Hall-Effect Sensor System for Gesture Recognition, Information Coding, and Processing.

FIG. 5 shows an example of a system 300 including a wearable-glove Hall-effect sensor system 310 in communication with a remote processing device 350, in accordance with the Hall-Effect Sensor System for Gesture Recognition, Information Coding, and Processing. Wearable-glove Hall-effect sensor system 310 may be configured similarly to wearable-glove Hall-effect sensor system 10 shown in FIG. 1, having a glove 320 with a sensor unit 322 and Hall-effect sensors 330 located near the tips of the finger and thumb portions of glove 320. System 300 may also include Hall-effect sensors 340 embedded within the uniform/clothing of a user 342 of Hall-effect sensor system 310. In some embodiments, such as in physical-therapy or other health monitoring, sensors 340 may be uniformly distributed in an array-like pattern throughout the clothing of user 342. In other embodiments, sensors 340 may be located only in some clothing of user 342.

Sensor unit 322 may be configured similarly as sensor unit 100 shown in FIG. 2. As such, sensor unit 322 contains a flux-producing element that has magnetic flux lines emanating therefrom, creating a magnetic flux region. Each of Hall-effect sensors 340 uniquely represents a location controller and associated software to determine the relative location of the user's hand. As an example, the corresponding information about the user's hand location may be reported directly or may have semantics and be defined and interpreted as commands, messages, or gestures for communication and/or computer input/control. Such communication may occur via a transceiver within sensor unit 322, which transmits signals over communication link 360 to an antenna 352 of a remote processing device 350. As an example, remote processing device 350 may be a computer having the requisite gesture recognition and/or information processing software installed therein.

Figure 6:
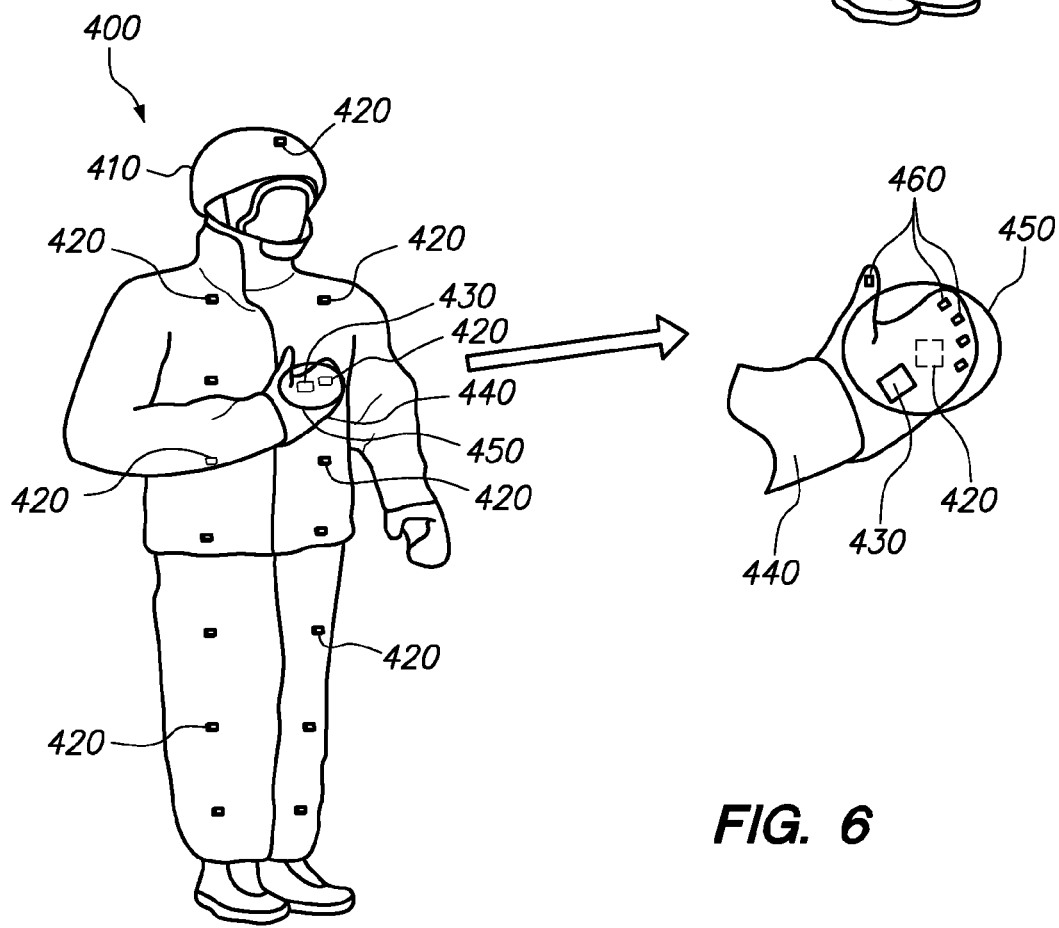
FIG. 6 shows a diagram illustrating the interaction of a hand-mounted Hall-effect sensor with a flux-producing element embedded on a user, in accordance with the Hall-Effect Sensor System for Gesture Recognition, Information Coding, and Processing.

FIG. 6 shows a diagram 400 illustrating the interaction of a hand-mounted Hall-effect sensor with a flux-producing element embedded on a user, in accordance with the Hall-Effect Sensor System for Gesture Recognition, Information Coding, and Processing. As shown, a plurality of flux-producing elements 420 is distributed in an array-like pattern along the body of user 410. The hand 440 of user 410 contains a sensor unit 430 secured thereto. As an example, sensor unit 430 may be secured to hand 410 via a wearable glove as shown in FIG. 1. Sensor unit 430 may be configured similarly to sensor unit 100 as shown in FIG. 2.

User 410 may communicate information by moving Hall-effect sensors 460 in close proximity to one of the flux-producing elements 420 such that some or all of Hall-effect sensors 460 are moving within the magnetic flux region 450 created by flux-producing element 420 perpendicular to at least some of the magnetic flux lines or to their non-zero perpendicular resolved vector components. In such a scenario, a Hall-voltage will be induced within the Hall-effect sensors 460 moving within the magnetic flux region, and affected Hall-effect sensors may process the information in accordance with a method such as method 700 as discussed with reference to FIG. 9. In some embodiments, user 410 may communicate information by placing one or more Hall-effect sensors 460 in close proximity to a flux-producing element located on another individual.

Figure 7:
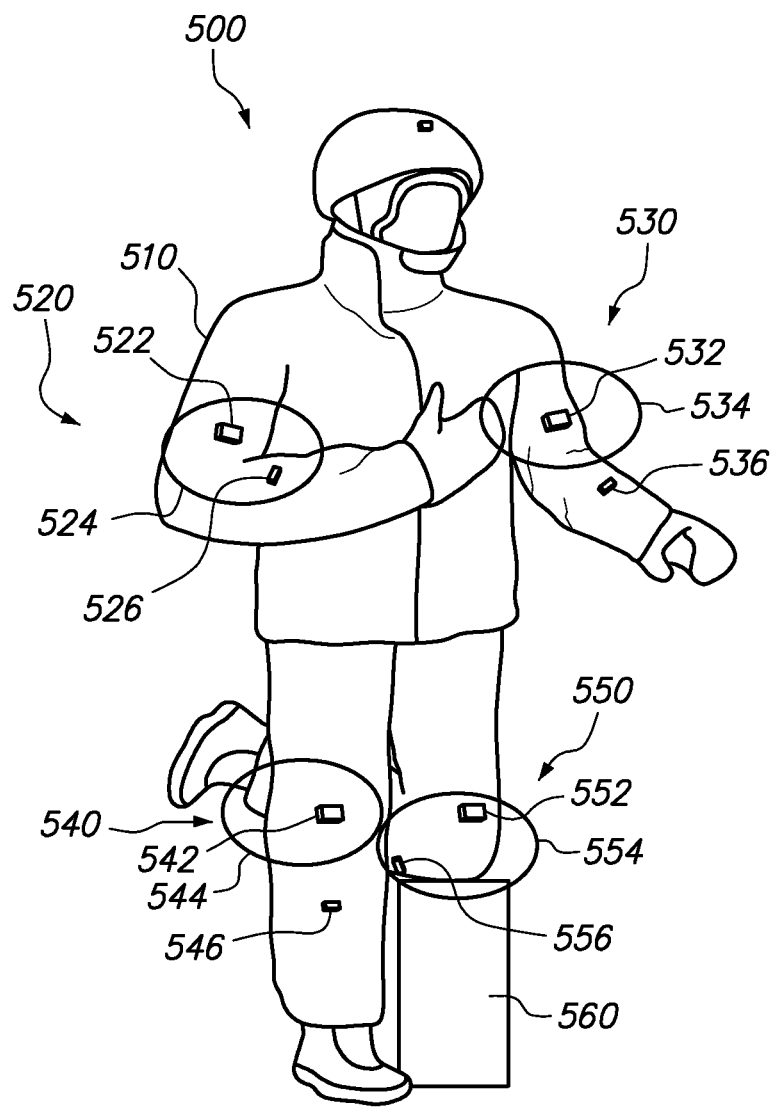
FIG. 7 shows a diagram of multiple Hall-effect sensor systems located on various parts of a user's body, in accordance with the Hall-Effect Sensor System for Gesture Recognition, Information Coding, and Processing.

FIG. 7 shows a diagram of multiple Hall-effect sensor systems located on various parts of a user's body, in accordance with the Hall-Effect Sensor System for Gesture Recognition, Information Coding, and Processing. A user 510 may have multiple sensor systems distributed at various locations of a user's body. As shown, a user 510 may have a first sensor system 520, a second sensor system 530, a third sensor system 540, and a fourth sensor system 550. However, a user may have additional or fewer sensor systems to allow for more or less covert communication.

First sensor system 520 may include a first sensor unit 522 having a flux-producing element (not shown) creating a magnetic flux region 524, and a first Hall-effect sensor 526. First sensor unit 522 may be secured to the upper right arm of user 510, while first Hall-effect sensor 526 may be secured to the upper forearm of user 510. Such a configuration allows user 510 to communicate by bending the right elbow such that first Hall-effect sensor 526 is moving within magnetic flux region 524.

Second sensor system 530 may include a second sensor unit 532 having a flux-producing element creating a magnetic flux region 534, and a second Hall-effect sensor 536. Second sensor unit 532 may be secured to the upper left arm of user 510, while second Hall-effect sensor 536 may be secured to the upper forearm of user 510. Such a configuration allows user 510 to communicate by bending the left elbow such that second Hall-effect sensor 536 is moving within magnetic-flux region 534.

Third sensor system 540 may include a third sensor unit 542 having a flux-producing element creating a magnetic flux region 544, and a third Hall-effect sensor 546. Third sensor unit 542 may be secured to the upper-right leg of user 510, while third Hall-effect sensor 546 may be secured to the upper-right calf of user 510. Such a configuration allows user 510 to communicate by bending the right knee such that third Hall-effect sensor 546 is moving within magnetic flux region 544.

Fourth sensor system 550 may include a fourth sensor unit 552 having a flux producing element creating a magnetic flux region 554, and a fourth Hall-effect sensor 556. Fourth sensor unit 552 may be secured to the upper left leg of user 510, while fourth Hall-effect sensor 556 may be secured to the upper left calf of user 510. As shown in the figure, user 510 may communicate by bending the right knee such that third Hall-effect sensor 546 is moving within magnetic flux region 554. Such communication may occur by user 510 performing an act such as kneeling on the ground or on an object 560.

The methods described above for covert communication also can be applied to other applications, such as the physical therapy scenario for patient motion tracking over time. In such an application, relevant information transmitted to an external computer or monitor would be the range of motion, which would not need to be interpreted as a gesture in a semantic sense.

Figure 8:
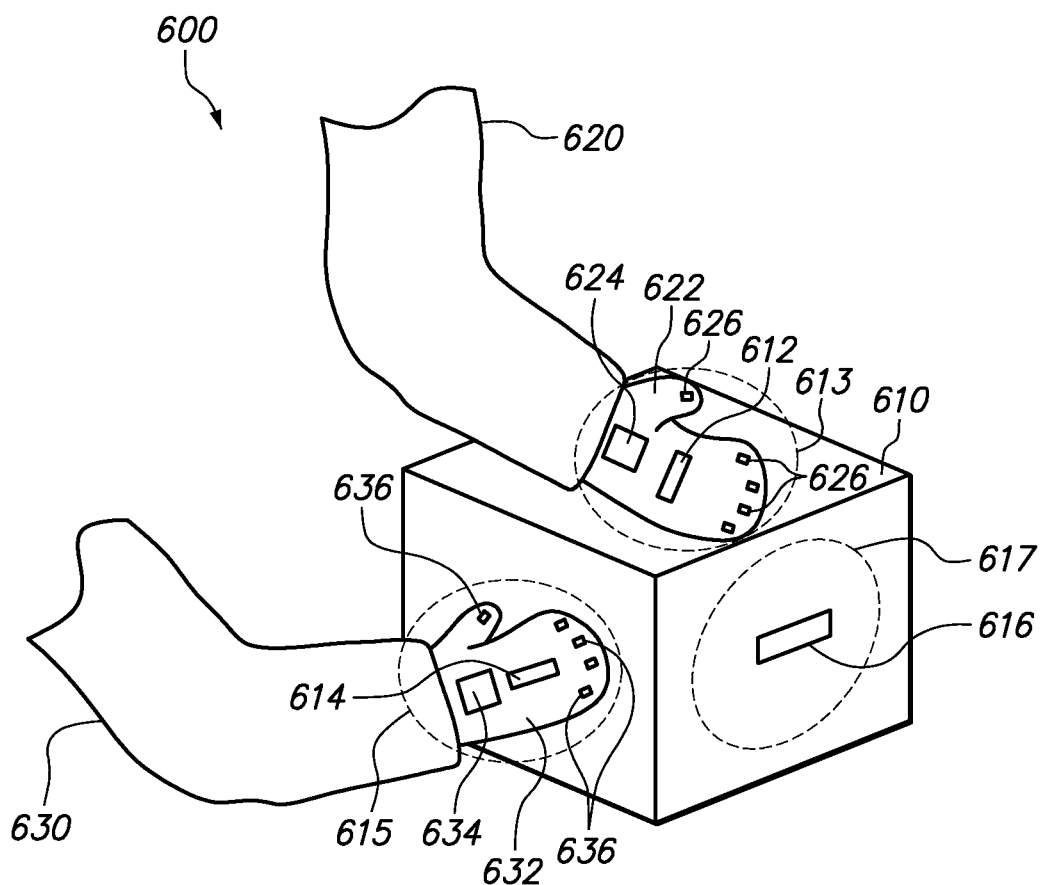
FIG. 8 shows a diagram illustrating the interaction of a hand-mounted sensor unit with flux-producing elements embedded within an object, in accordance with the Hall-Effect Sensor System for Gesture Recognition, Information Coding, and Processing.

FIG. 8 shows a diagram 600 illustrating the interaction of a hand-mounted sensor unit with flux-producing elements embedded within an object 610, in accordance with the Hall-Effect Sensor System for Gesture Recognition, Information Coding, and Processing. Object 610 may include multiple flux-producing elements, such as elements 612, 614, and 616 embedded in various locations therein. Flux-producing element 612 creates a magnetic flux region 613, flux-producing element 614 creates a magnetic flux region 615, and flux-producing element 616 produces a magnetic flux region 617. Examples of object 610 may include fixed-location equipment, mobile equipment, and weapons. In some embodiments, object 610 may include one or more flux producing elements.

A user, represented by arms 620 and 630, may have a first sensor unit 624 secured to a left hand 622 and a second sensor unit 634 secured to a right hand 632. Hand 622 contains Hall-effect sensors 626 attached thereto, while hand 632 contains Hall-effect sensors 636 attached thereto. The user may communicate information by grasping object 610 such that some or all of Hall-effect sensors 626 and 636 are moving within magnetic flux regions 613, 615, or 617. Sensors 626 and 636 may then transmit a signal to sensor unit 624 and 634, respectively, which then may transmit a signal to a remote processor for further processing.

In the case of covert communications, benefits to this type of communication include the ability to generate discretely a wide range of commands, words, messages, signals, semaphores, or gestures. In the case of the physical therapy application, a physical therapist can track separately the progress of recovery in several areas simultaneously in a patient with multiple injuries to different parts of the body.

Figure 9:
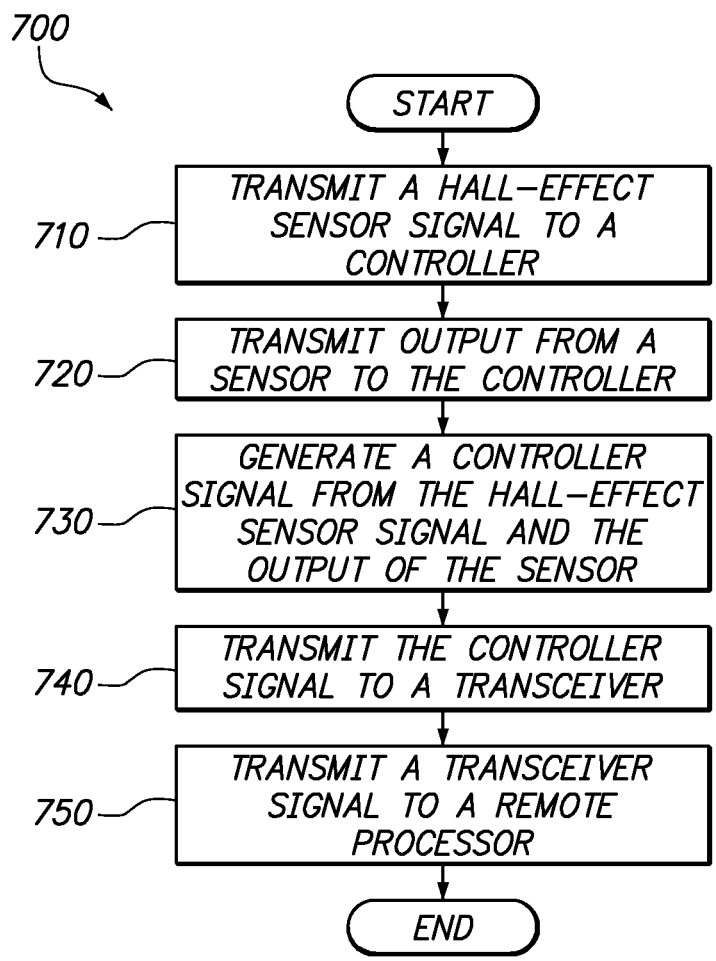
FIG. 9 shows a flowchart of an embodiment of a method for use in accordance with the Hall-Effect Sensor System for Gesture Recognition, Information Coding, and Processing.

FIG. 9 shows a flowchart of an embodiment of a method 700 for use in accordance with the Hall-Effect Sensor System for Gesture Recognition, Information Coding, and Processing. Method 700 may be performed by a Hall-effect sensor system such as any of the systems discussed herein. For illustrative purposes, method 700 will be discussed with reference to system 10 of FIG. 1 having sensor unit 100, as shown in FIG. 2, incorporated therein.

Method 700 may begin at step 710, which involves transmitting, from a Hall-effect sensor 180, 182, 184, 186, and/or 188, connected to a controller 110, a Hall-effect sensor signal to the controller when the Hall-effect sensor is perpendicular to at least some of the magnetic flux lines, or when a non-zero resolved vector component of the motion of the Hall-effect sensor is perpendicular to the non-zero resolved vector component of at least some of the plurality of magnetic flux lines from a flux-producing element 120. Step 720 may then involve transmitting, to controller 110, output from a sensor, such as motion sensor 160 and/or orientation sensor 170, connected to controller 110. In some embodiments, method 700 does not include step 720, and instead proceeds directly to step 730 from step 710.

Step 730 involves generating a controller signal from the Hall-effect sensor signal and the output of sensor 160 and/or 170. Step 730 may be performed by logic stored within controller 110. Method 700 may then continue to step 740, which involves transmitting the controller signal to a transceiver 130 connected to controller 110. Method 700 may also include step 750, which involves transmitting a transceiver signal to a remote processor, such as remote processor 350 shown in FIG. 5, via antenna 140. Step 750 may be performed by logic stored within controller 110.

Figure 10:
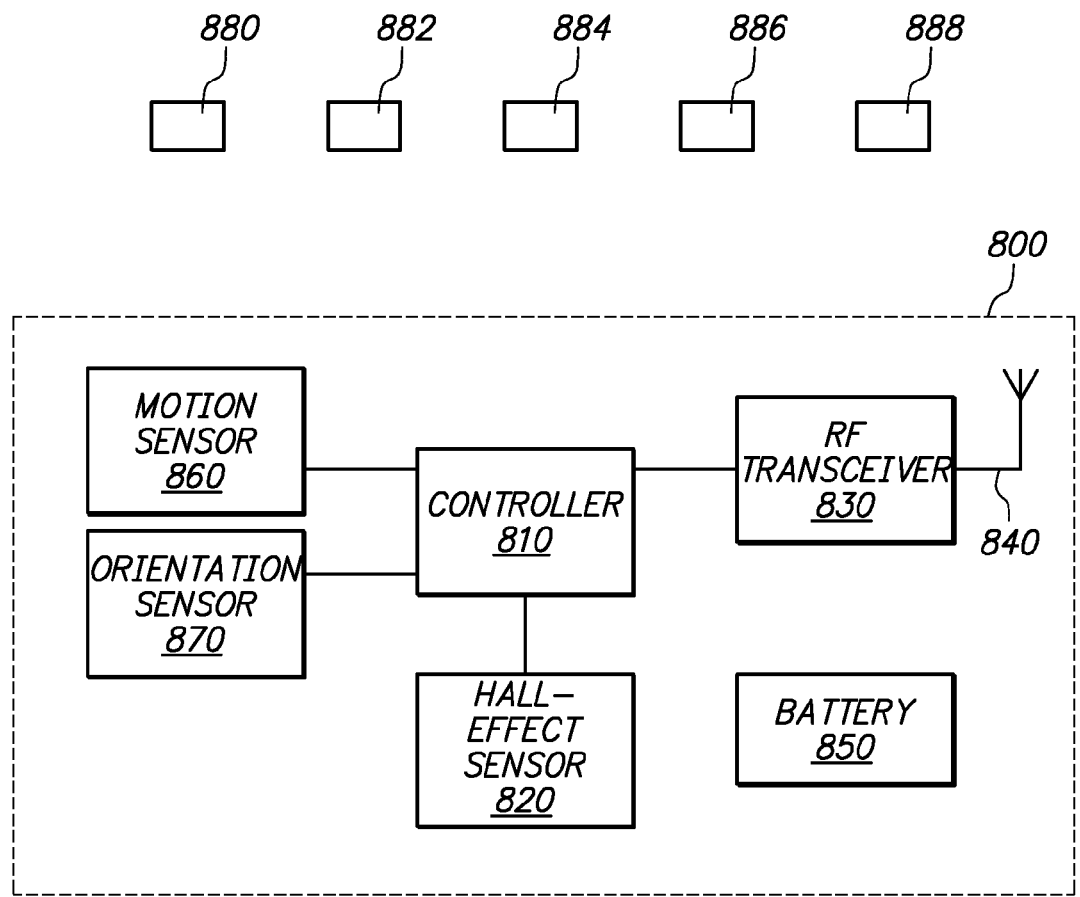
FIG. 10 shows a block diagram of an embodiment of a Hall-effect sensor system including a sensor unit connected to multiple flux-producing elements, in accordance with the Hall-Effect Sensor System for Gesture Recognition, Information Coding, and Processing.

FIG. 10 shows a block diagram of an embodiment of a Hall-effect sensor system including sensor unit 800 connected to multiple flux-producing elements, in accordance with the Hall-Effect Sensor System for Gesture Recognition, Information Coding, and Processing. Sensor unit 800 may include a controller 810, having a Hall-effect sensor 820, RF transceiver 830, antenna 840, power supply 850, such as a battery, motion sensor 860, and orientation sensor 870 connected thereto. Controller 810 may contain signal processing algorithms stored therein, and may also define transmission data protocol. As an example, motion sensor 860 may be a three-axis accelerometer for providing linear motion information and orientation sensor 870 may be a three-axis gyroscope to provide rotation motion information. Hall-effect sensor 820 is configured to detect magnetic field changes produced by one or more of flux-producing elements 880, 882, 884, 886, and 888 moving within its detection region.

For example, the system shown in FIG. 10 may be used in applications where flux-producing elements 880, 882, 884, 886, and 888 are transmitting coded data, applications in which the set of gestures is intentionally limited, and/or applications in which a 3-dimensional Hall-effect sensor 820 is used in combination with controller 810 to estimate the relative positions of flux-producing elements 880, 882, 884, 886, and 888.

In some embodiments, sensor unit 800 and flux-producing elements 880, 882, 884, 886, and 888 are coupled to a wearable glove (see FIG. 1) having a palm portion, a plurality of finger portions, and a thumb portion. In such embodiments, sensor unit 800 may be coupled to the back of the palm portion and flux-producing elements 880, 882, 884, 886, and 888 may be coupled to the wearable glove near the tip of each finger portion and the thumb portion.

Figure 11:
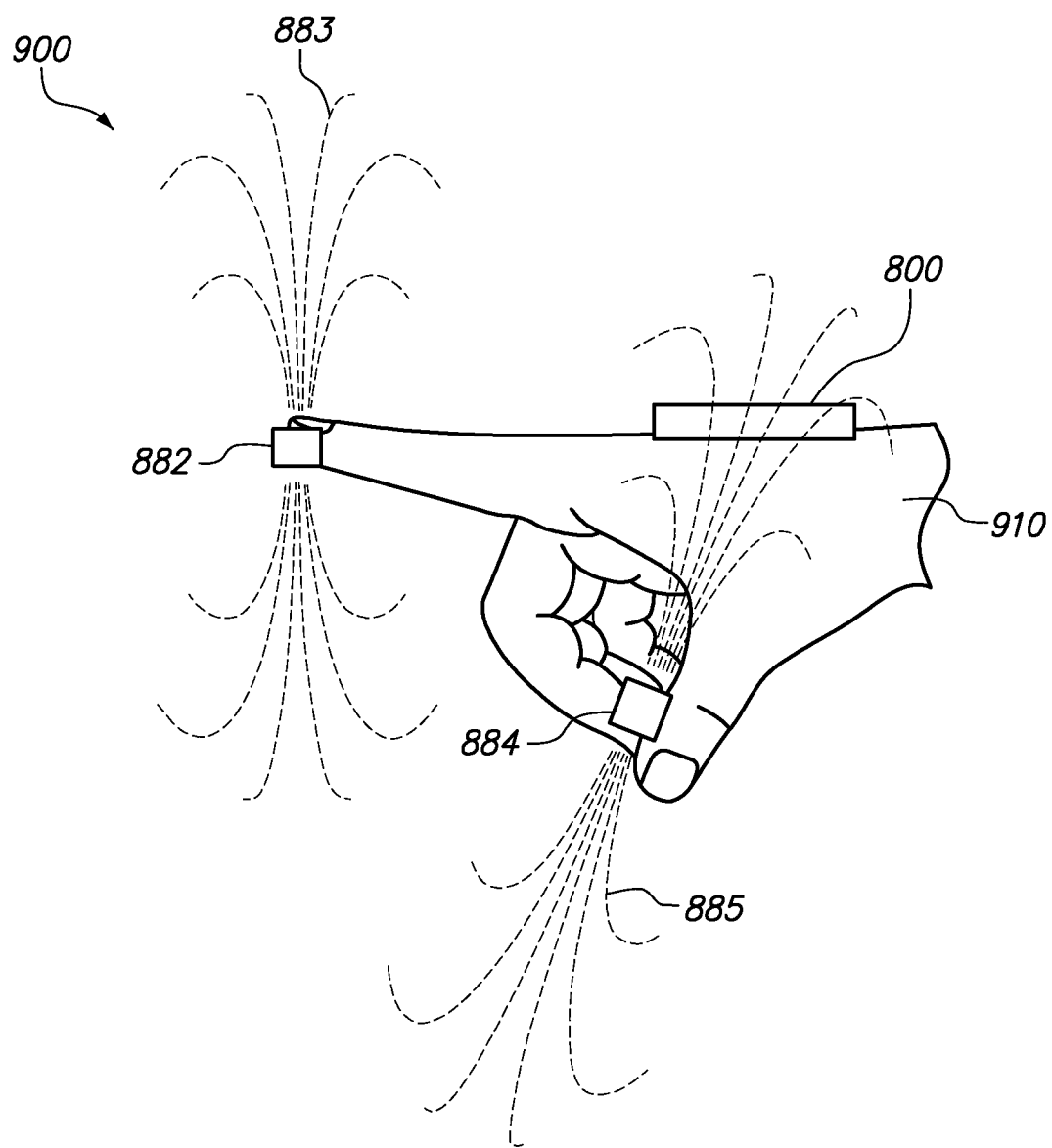
FIG. 11 shows an example of a gesture diagram involving the sensor unit and flux-producing elements shown in FIG. 10, in accordance with the Hall-Effect Sensor System for Gesture Recognition, Information Coding, and Processing.

FIG. 11 shows an example of a gesture diagram 900 involving the sensor unit and flux-producing elements shown in FIG. 10, in accordance with the Hall-Effect Sensor System for Gesture Recognition, Information Coding, and Processing. Sensor unit 800 is located on the back of a user's hand 910, while flux-producing elements 882 and 884 are coupled to the tips of a user's index and middle fingers, respectively. Flux-producing element 882 produces magnetic flux lines 883, while flux-producing element 884 produces magnetic flux lines 885. As shown, Hall-effect sensor 820 (shown in FIG. 10) will detect a magnetic field change caused by flux-producing element 884, as magnetic flux lines 885 intersect sensor unit 800, or when a non-zero resolved vector component of the motion of the flux-producing element is perpendicular to the non-zero resolved vector component of Hall-effect sensor 820. Hall-effect sensor 820 may then transmit a signal to controller 810 (shown in FIG. 10) for processing. In some embodiments, sensor unit 800 and the flux-producing elements may also be coupled to a wearable glove, such as the glove shown in FIG. 1.

Figure 12:
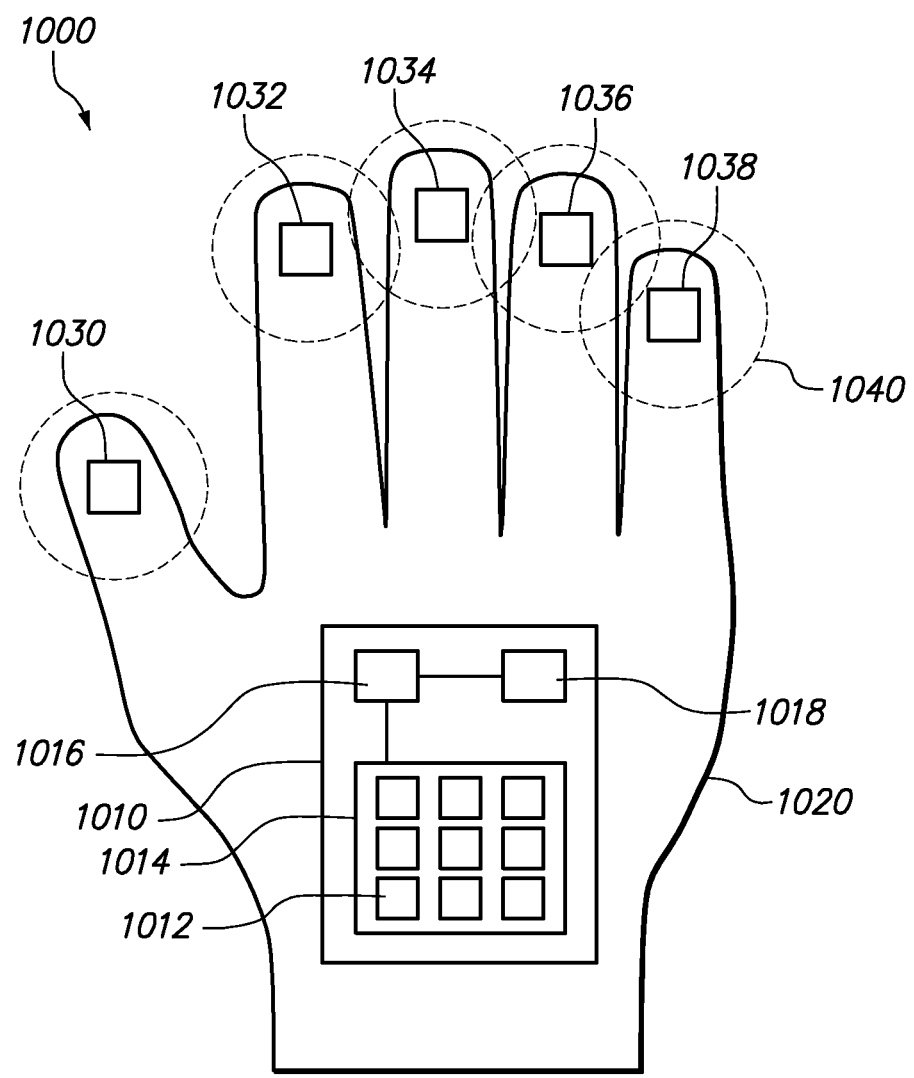
FIG. 12 shows a diagram of an embodiment of a Hall-effect sensor system including a sensor unit having an array of Hall-effect sensors, in accordance with the Hall-Effect Sensor System for Gesture Recognition, Information Coding, and Processing.

FIG. 12 shows a diagram of an embodiment of a Hall-effect sensor system 1000 including a sensor unit having an array of Hall-effect sensors, in accordance with the Hall-Effect Sensor System for Gesture Recognition, Information Coding, and Processing. System 1000 may include a sensor unit 1010 coupled to the back palm region of a user's hand 1020. Sensor unit 1010 may include a plurality of Hall-effect sensors 1012. In some embodiments, Hall-effect sensors 1012 may be arranged in an array 1014. Sensor unit 1010 may otherwise be configured similarly to sensor unit 800 of FIG. 10, including a controller 1016 connected to Hall-effect sensors 1012, an RF transceiver 1018 connected to controller 1016, and a power source, motion sensor, and an orientation sensor (not shown). In some embodiments, controller 1016 is connected to each individual Hall-effect sensor 1012 of array 1014. In other embodiments, each of the Hall-effect sensors 1012 are connected as part of array 1014 and controller 1016 is connected to the array 1014.

System 1000 further include flux-producing elements 1030, 1032, 1034, 1036, and 1038, which may be, for example, coupled to a user's hand near the tips of the fingers and thumb. In some embodiments, sensor unit 1010 and the flux-producing elements may also be coupled to a wearable glove, such as the glove shown in FIG. 1. Each individual Hall-effect sensor 1012 may be configured to independently detect magnetic flux 1040 generated from flux-producing elements 1030, 1032, 1034, 1036 and 1038, when the flux-producing elements are brought into proximity to one or more of Hall-effect sensors 1012. In some embodiments, the plurality of Hall-effect sensors 1012 may be arranged along a length of the user's hand. The Hall-effect sensor configuration of system 1000 enables the detection of varying levels and orientations of flux along the length of, or across the surface of, a user's hand.

Figure 13:
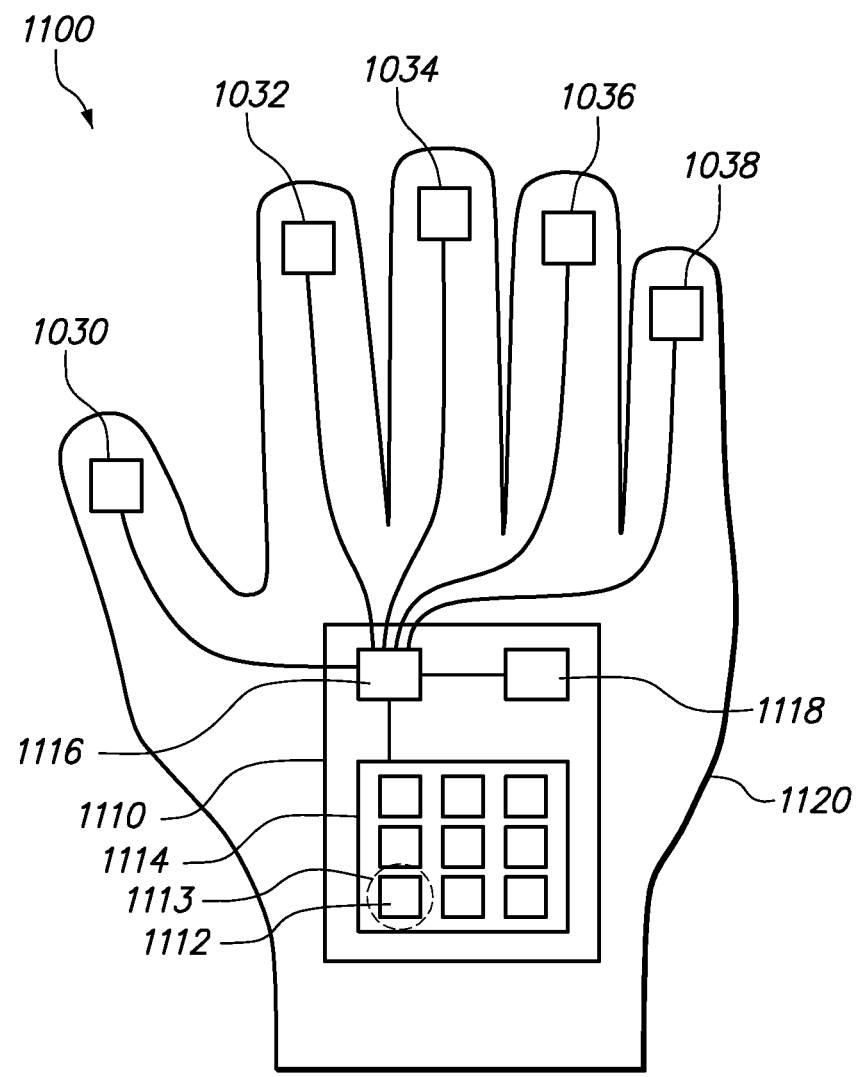
FIG. 13 shows a diagram of an embodiment of a Hall-effect sensor system including a sensor unit having an array of flux-producing elements, in accordance with the Hall-Effect Sensor System for Gesture Recognition, Information Coding, and Processing.

FIG. 13 shows a diagram of an embodiment of a Hall-effect sensor system including a sensor unit having an array of flux-producing elements, in accordance with the Hall-Effect Sensor System for Gesture Recognition, Information Coding, and Processing. System 1100 may include a sensor unit 1110 coupled to the back palm region of a user's hand 1120. Sensor unit 1110 may include a plurality of flux-producing elements 1112 having magnetic flux 1113 emanating therefrom. In some embodiments, flux-producing elements 1112 may be arranged in an array 1114. Sensor unit 1110 may otherwise be configured similarly to sensor unit 100 of FIG. 2, including a controller 1116, an RF transceiver 1118, and a power source, motion sensor, and orientation sensor (not shown).

System 1100 further includes Hall-effect sensors 1130, 1132, 1134, 1136, and 1138 connected, via wire, to sensor unit 1110, more particularly to controller 1116 contained therein. In some embodiments, each of the Hall-effect sensors may be coupled to a user's hand near the tips of the fingers and thumb. In some embodiments, sensor unit 1110 and the flux-producing elements may also be coupled to a wearable glove, such as the glove shown in FIG. 1.

Each individual flux-producing element 1112 produces magnetic flux 1113 that may be detected by each of Hall-effect sensors 1130, 1132, 1134, 1136, and 1138 when the Hall-effect sensors are brought into proximity to flux-producing elements 1112. In some embodiments, the plurality of flux-producing elements 1112 may be arranged along a length of the user's hand. The flux-producing element configuration of system 1100 enables the detection of varying levels and orientations of flux along the length of, or across the surface of, a user's hand.

Figure 14:
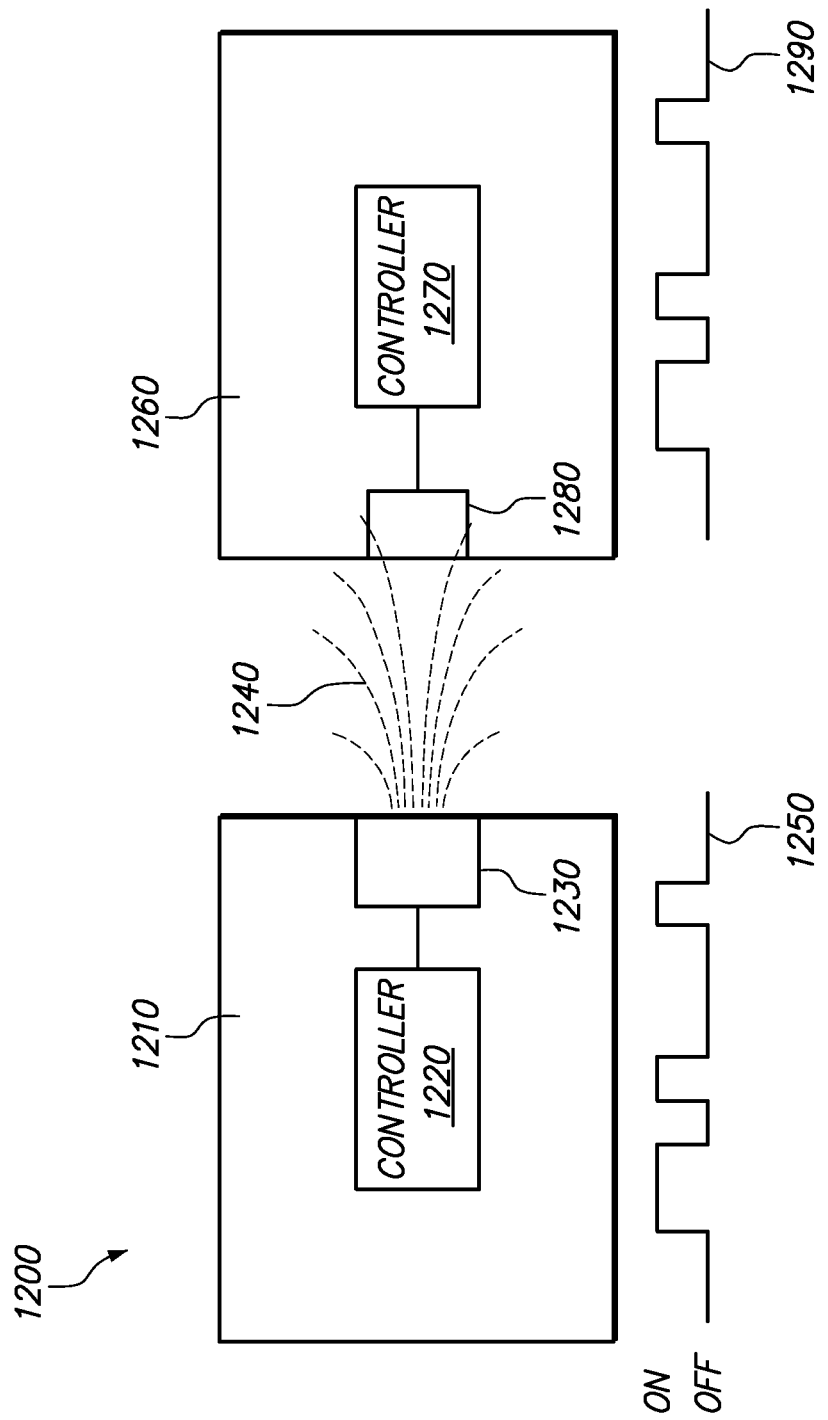
FIG. 14 shows a diagram of an information transfer system using a Hall-effect sensor system, in accordance with the Hall-Effect Sensor System for Gesture Recognition, Information Coding, and Processing.

FIG. 14 shows a diagram of an information transfer system 1200 using a Hall-effect sensor system, in accordance with the Hall-Effect Sensor System for Gesture Recognition, Information Coding, and Processing. System 1200 may include a first system 1210 and a second system 1260. First system 1210 includes a controller 1220 and a flux-producing element 1230 connected thereto. Flux-producing element 1230 is configured to transmit magnetic flux lines 1240 modulated to represent a signal 1250. To produce signal 1250, controller 1220 is configured to turn flux-producing element 1230 on and off at the appropriate times to generate and transmit signal 1250, via magnetic flux lines 1240, as shown.

Second system 1260 includes controller 1270 and Hall-effect sensor 1280 connected thereto. Hall-effect sensor 1280 is located in proximity to flux-producing element 1230 such that Hall-effect sensor 1280 receives signal 1250 via magnetic flux lines 1240. Hall-effect sensor 1280 is configured to sense the changes in the magnetic flux lines 1240 and then transmit the received signal 1290 to controller 1270. Controller 1270 contains the appropriate software and protocols to process received signal 1290. In some embodiments, second system 1260 may further include an RF transmitter and antenna to transmit received signal 1290 to a remote processor, as shown in FIG. 5.

As an example, the configuration of system 1200 may be used to communicate between two individuals. In such a scenario, first system 1210 may be embedded within the clothing of, or otherwise attached to, a first individual, while second system 1260 is embedded within the clothing of, or otherwise attached to, a second individual. When the two individuals are in close proximity, information transfer may occur via system 1200 as described above.

Many modifications and variations of the Hall-Effect Sensor System for Gesture Recognition, Information Coding, and Processing are possible in light of the above description. Within the scope of the appended claims, the Hall-Effect Sensor System for Gesture Recognition, Information Coding, and Processing may be practiced otherwise than as specifically described. Further, the scope of the claims is not limited to the implementations and embodiments disclosed herein, but extends to other implementations and embodiments as may be contemplated by those having ordinary skill in the art.

We claim:

1. A system comprising:
   a controller;
   a Hall-effect sensor connected to the controller;
   a transceiver connected to the controller; and
   a flux-producing element, having a plurality of magnetic flux lines emanating therefrom, wherein the Hall-effect sensor is configured to transmit a Hall-effect sensor signal to the controller when a non-zero resolved vector component of the motion of the Hall-effect sensor is perpendicular to the non-zero resolved vector component of at least some of the plurality of magnetic flux lines, and the controller is configured to transmit a controller signal to the transceiver after receiving the Hall-effect sensor signal.

2. The system of claim 1, wherein the transceiver is configured to transmit a transceiver signal to a remote processor via an antenna after receiving the controller signal.

3. The system of claim 2, wherein the transceiver signal comprises information from the controller signal.

4. The system of claim 1, further comprising a wearable glove having a palm portion and at least one finger portion, wherein the controller, transceiver, and flux-producing element are coupled to the palm portion and the Hall-effect sensor is coupled to the wearable glove near the tip of the at least one finger portion.

5. The system of claim 4, wherein the flux-producing element is coupled to the palm portion and oriented such that at least some of the plurality of magnetic flux lines extend below the palm portion.

6. The system of claim 1, further comprising a wearable glove having a palm portion and at least one finger portion, wherein the controller and transceiver are coupled to the palm portion and the at least one Hall-effect sensor is coupled to the wearable glove near the tip of the at least one finger portion.

7. The system of claim 6, wherein the flux-producing element is coupled to an object separate from the wearable glove.

8. The system of claim 7, wherein the Hall-effect sensor signal comprises data received from the flux-producing element.

9. The system of claim 1 further comprising:
   an accelerometer connected to the controller; and
   a gyroscope connected to the controller
   wherein the controller signal comprises output from the accelerometer and the gyroscope.

10. The system of claim 1, wherein the at least one Hall-effect sensor is a plurality of Hall-effect sensors arranged in an array.

11. The system of claim 1, wherein the at least one flux-producing element is a plurality of flux-producing elements arranged in an array.

12. A system comprising:

a wearable glove having a palm portion and at least one finger portion;

a controller coupled to the palm portion;

a Hall-effect sensor, coupled to the tip of at least one of the finger portions, connected to the controller;

a transceiver, coupled to the palm portion, connected to the controller;

a flux-producing element, having a plurality of magnetic flux lines emanating therefrom, coupled to the palm portion, wherein the flux-producing element is oriented such that at least some of the plurality of magnetic flux lines extend below the palm portion; and a power supply, coupled to the palm portion, connected to the controller and the transceiver wherein the Hall-effect sensor is configured to transmit a Hall-effect sensor signal to the controller when at least one non-zero resolved vector component of the motion of the Hall-effect sensor is perpendicular to the non-zero resolved vector component of at least some of the plurality of magnetic flux lines, and the controller is configured to transmit a controller signal to the transceiver after receiving the Hall-effect sensor signal.

13. The system of claim 12 further comprising:

an accelerometer connected to the controller; and a gyroscope connected to the controller wherein the controller signal comprises output from the accelerometer and the gyroscope.

14. The system of claim 12, wherein the transceiver is configured to transmit a transceiver signal to a remote processor after receiving the controller signal.

15. A method comprising the steps of:

transmitting, from a Hall-effect sensor connected to a controller, a Hall-effect sensor signal to the controller when at least one non-zero resolved vector component of the motion of the Hall-effect sensor is perpendicular to a non-zero resolved vector component of at least some of the plurality of magnetic flux lines emanating from a flux-producing element;

transmitting, to the controller, output from a sensor connected to the controller;

generating a controller signal from the Hall-effect sensor signal and the output of the sensor; and transmitting the controller signal to a transceiver connected to the controller.

16. The method of claim 15, wherein the sensor is an accelerometer.

17. The method of claim 15 further comprising the step of transmitting a transceiver signal to a remote processor via an antenna connected to the transceiver.

18. The method of claim 15, wherein the Hall-effect sensor, controller, flux-producing element, sensor, and transceiver are coupled to a wearable glove having a palm portion and at least one finger portion, wherein the controller, flux-producing element, sensor, and transceiver are coupled to the palm portion and the Hall-effect sensor is coupled near the tip of the at least one finger portion.

19. The method of claim 15, wherein the Hall-effect sensor, controller, sensor, and transceiver are coupled to a wearable glove having a palm portion and at least one finger portion, wherein the controller, sensor, and transceiver are coupled to the palm portion and the Hall-effect sensor is coupled near the tip of the at least one finger portion, and wherein the flux-producing element is coupled to an object separate from the wearable glove.

* * * * *